(12) United States Patent
Ichihara

(10) Patent No.: US 8,873,275 B2
(45) Date of Patent: Oct. 28, 2014

(54) SEMICONDUCTOR STORAGE DEVICE

(71) Applicant: Kabushika Kaisha Toshiba, Tokyo (JP)

(72) Inventor: Reika Ichihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/017,252

(22) Filed: Sep. 3, 2013

(65) Prior Publication Data

US 2014/0269000 A1  Sep. 18, 2014

(51) Int. Cl.
*G11C 13/00* (2006.01)

(52) U.S. Cl.
CPC ........ *G11C 13/0069* (2013.01); *G11C 13/0002* (2013.01)
USPC .................. 365/148; 365/185.03; 365/185.22

(58) Field of Classification Search
CPC .................................................. G11C 13/0069
USPC .......................................................... 365/148
See application file for complete search history.

(56) References Cited

U.S. PATENT DOCUMENTS

| 7,558,099 B2 * | 7/2009 | Morimoto ..................... 365/148 |
| 2012/0014164 A1 * | 1/2012 | Kamoshida et al. .......... 365/148 |

FOREIGN PATENT DOCUMENTS

JP         2012-203926 A        10/2012

* cited by examiner

*Primary Examiner* — Hoai V Ho
*Assistant Examiner* — Muhammad Islam
(74) *Attorney, Agent, or Firm* — Patterson & Sheridan, LLP

(57) ABSTRACT

According to one embodiment, a semiconductor storage device includes multiple memory cells that include a variable resistance element and a control circuit to control the voltage that is applied to the memory cell. The control circuit is configured so that, during the set operation in which the variable resistance element is changed to the set state, a set voltage of a first polarity is applied to the select memory cell. The control circuit is configured so that, during the reset operation in which the variable resistance elements are changed to the reset state, and a cancel voltage of the first polarity is applied to an unselected memory cell to which voltage that is less than the reset voltage was applied. The voltage value and the voltage application time of the set voltage and the voltage value and the voltage application time of the cancel voltage have a set relationship.

20 Claims, 16 Drawing Sheets

SET OPERATION

SELECTED CELL
MC20

HALF-SELECTED CELLS
MC21
MC22
MC10
MC00

UNSELECTED CELLS
MC11
MC12
MC01
MC02

RESET OPERATION

CONDUCTIVE VOLTAGE Vth OF THE HALF-SELECTED MEMORY CELL

SEMICONDUCTOR STORAGE DEVICE

CROSS-REFERENCE TO RELATED APPLICATION

This application is based upon and claims the benefit of priority from Japanese Patent Application No. 2013-049934, filed Mar. 13, 2013, the entire contents of which are incorporated herein by reference.

FIELD

Embodiments described herein relate generally to a semiconductor storage device that includes memory cells, which each use variations in the resistance value of a variable resistance element to store data.

BACKGROUND

In recent years, resistance random access memory devices that use variable resistance elements as storage elements have attracted attention as a candidate for the successor of flash memory. Here, resistance random access memory devices shall include not only resistance random access memory in the narrow sense, in which transition metal oxides comprise the recording layers and their resistance value state is recorded in a nonvolatile manner (ReRAM: Resistive RAM), but also phase-change memory (PCRAM: Phase-Change RAM), which uses chalcogenides, etc., as the recording layer(s), which utilizes the resistance value shift between its crystalline state (a conductor) and its amorphous state (an insulator) to store information.

In the memory cell array of the resistance random access memory device, memory cells that include variable resistance elements are placed at the intersection of the bit line and the word line. Also, by alternately layering the bit line and the word line and by stacking and arranging the memory cell array three-dimensionally, a high-density memory cell array can be realized.

When applying a voltage to a selected memory cell, which is large enough to change its resistance state, there are cases where the voltage is also undesirably applied to other half-selected memory cells in the memory cell array. The resistance state or the threshold voltage of the half-selected memory cell is affected by this voltage, and there is a concern that data retained in the half-selected memory cell will be undesirably changed. Unselected memory cells may have similar problems, when applying voltages to bit lines and word lines have undesirable different timings.

DETAILED DESCRIPTION

Figure 1:
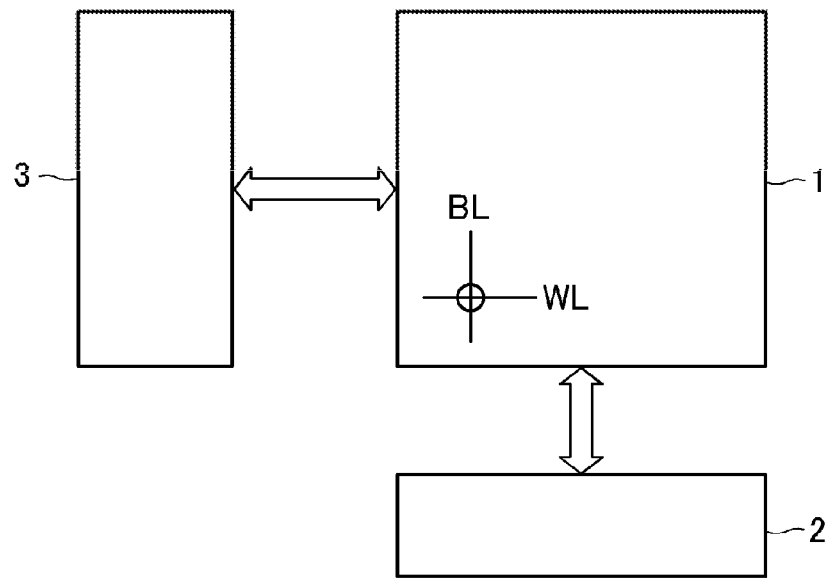
FIG. 1 is a block diagram of a semiconductor storage device according to a first embodiment.

Embodiments provide a semiconductor storage device that can suppress the fluctuation in the resistance state of the memory cell.

In general, the embodiments of the present disclosure are described with reference to the drawings. Meanwhile, in the descriptions in the drawings of the embodiments, parts that have the same configuration will be given the same reference notations, and their redundant descriptions will be omitted.

Some embodiment of the invention may include a semiconductor storage device that has multiple first wires, multiple second wires that extend to intersect with the first wires, multiple memory cells that are placed in each intersection part of the first wires and the second wires and that include a variable resistance element, a control circuit that controls voltage applied to the memory cells, wherein the variable resistance elements include silicon oxide as base material, the control circuit is configured so that a set voltage of a first polarity is applied to the selected memory cell during a set operation in which the variable resistance element is changed to a set state that is conducted at a first voltage in the first polarity, the control circuit is configured so that, during the reset operation wherein the variable resistance element is changed to a reset state that is conducted at a second voltage higher than the first voltage in the first polarity, a reset voltage of a second polarity opposite to the first polarity is applied to the selected memory cell, and a cancel voltage of the first polarity is applied to an half-selected memory cell to which a voltage lower than the reset voltage is applied, and the relationship between a voltage value (Vs) and a voltage application time (Ts) of the set voltage and a voltage value (Vcancel) and a voltage application time (Tcancel) of the cancel voltage satisfies, $$-\frac{Vs}{\ln\left(\frac{Ts}{A}\right)} > -\frac{2Vcancel}{\ln\left(\frac{Tcancel}{A}\right)},$$

where A is a constant. In one example, A equals 1000.

Overall Structure

FIG. 1 is a block diagram that shows a configuration of a nonvolatile memory according to the first embodiment of the present invention. This nonvolatile memory includes a memory cell array 1 wherein memory cells that use variable resistance elements VR described later are arranged in a matrix.

A column control circuit 2 that controls the voltage of a bit line BL is electrically connected to the bit line BL of the memory cell array 1 in order to select the bit line BL of the memory cell array 1 and carry out a data erase operation of the memory cell, a data write operation to the memory cell and a data readout operation from the memory cell. A row control circuit 3 that controls the voltage of a word line WL is electrically connected to the word line WL of the memory cell array 1 in order to select the word line WL of the memory cell array 1 and carry out the data erase operation of the memory cell, the data write operation to the memory cell and the data read operation from the memory cell.

Memory Cell Array 1

Figure 2:
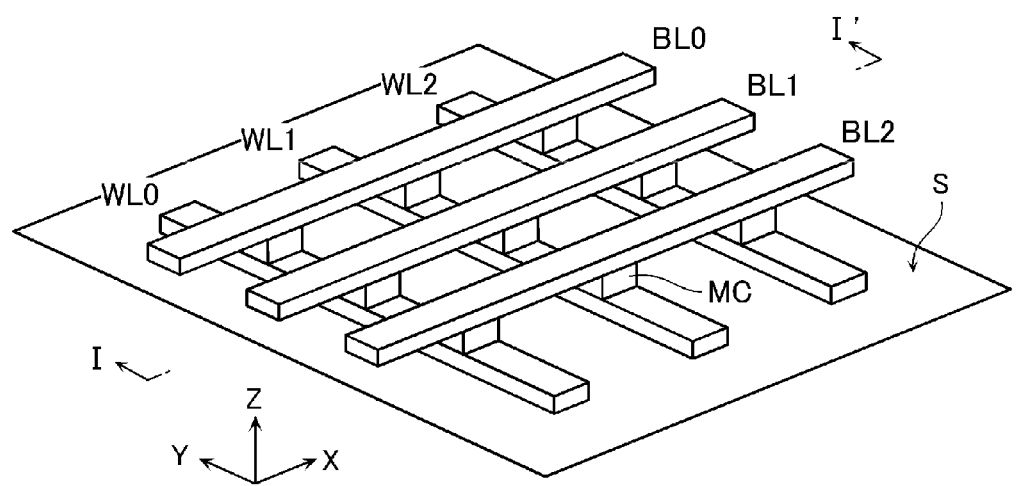
FIG. 2 is an isometric view of a portion of a memory cell array according to one embodiment.
Figure 3:
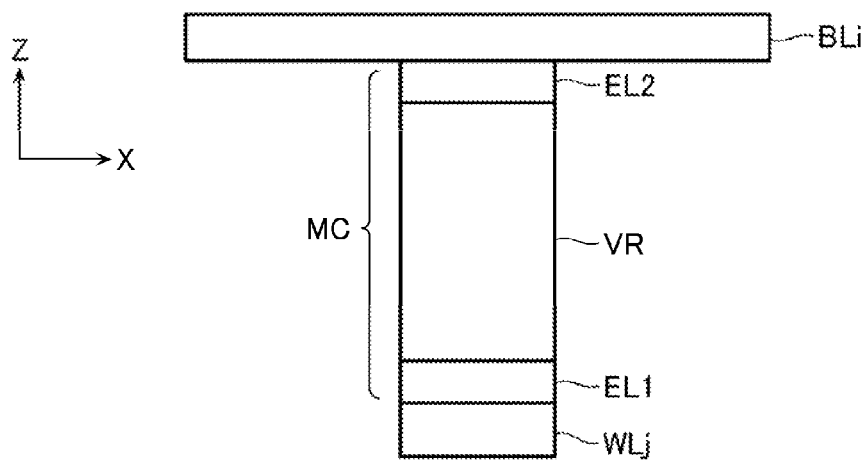
FIG. 3 is a cross-sectional view of a memory cell as seen in an arrow direction by cutting along a I-I' line shown in FIG. 2 according to one embodiment.

FIG. 2 is an isometric view of part of the memory cell array 1, and FIG. 3 is a cross-sectional diagram of one memory cell as seen in an arrow direction by cutting along a I-I' line in FIG. 2. Word lines WL0 to WL2 are arranged in a Y-direction that is parallel to a surface of a semiconductor substrate S as multiple first wires. Bit lines BL0 to BL2 are arranged in an X-direction that is parallel to the surface of the semiconductor substrate S as multiple second wires so as to intersect with the word lines WL. A memory cell MC is placed at each intersection of the word lines WL0 to WL2 and the bit lines BL0 to BL2 so that the memory cell is sandwiched by both wires. Materials of the first and the second wires are preferably materials that are resistant to heat and have low resistance values and, for example, may include tungsten (W), tungsten nitride (WN), tungsten silicide (WSi), nickel silicide (NiSi), and cobalt silicide (CoSi), etc. can be used.

Memory Cell MC

As shown in FIG. 3, the memory cell MC is a circuit in which the variable resistance element VR is connected between a bit line BL (e.g., bit line BLi) and the word line WL (e.g., word line WLj). Above and below in a Z-direction of the variable resistance elements VR are placed electrodes EL1 and EL2 that function as barrier metals and as an adhesion layer. A variable resistance element VR is placed on the electrode EL1, and the electrode EL2 is placed on the variable resistance elements VR. Regarding the electrode material of the electrode EL2, materials that include a metal element that makes up a conductive filament are used. Metal elements used for the electrode EL2 can be selected from, for example, Ag, Ni, Co, Al, Zn, Ti, Ta, and Cu, etc. The electrode EL2 can also have further layered on the electrode materials such as silicon, W, Ti, $TiN_x$, $TiSi_x$, $TiSi_xNy$, Ta, $TaN_x$, and $TaSi_xNy$ that may contain dopants. Various metal elements can be used for the electrode EL1 and can be, for example, selected from materials such as silicon, W, Ti, $TiN_x$, $TiSi_x$, $TiSi_xNy$, Ta, $TaN_x$, and $TaSi_xNy$ that may contain dopants and/or be formed in a laminate structure.

Variable Resistance Elements

For the variable resistance elements VR, a substance that can change the resistance value by applying voltage via electrical field, electric current, heat, and chemical energy, etc. can be used. The variable resistance elements VR are formed of, for example, a film including silicon oxide ($SiO_x$) as the base material. Specifically, the variable resistance elements VR are formed of a film consists of a single-layer film of silicon oxide ($SiO_x$) or a structure in which silicon oxide ($SiO_x$) and a semiconductor or an insulator are layered. Examples of semiconductors or insulators that are layered on the silicon oxide ($SiO_x$) include silicon (Si), hafnium oxide ($HfO_x$), etc. An additional layer can be inserted between silicon oxide (SiOx) and EL1, and/or inserted between silicon oxide (SiOx) and EL2. The variable resistance elements VR of the present embodiment have different current-voltage characteristics, depending on its state. Utilizing this, the variable resistance elements VR can be used as a selected memory element.

(Memory Cell Array and the Peripheral Circuit)

Figure 4:
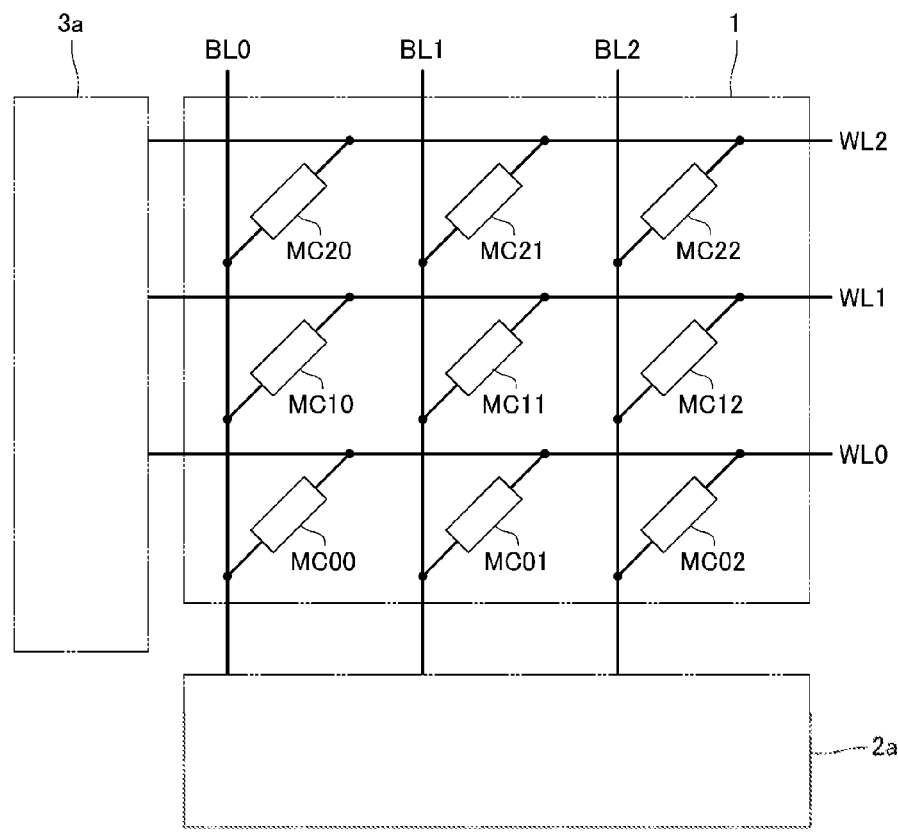
FIG. 4 is a circuit diagram illustrating interconnected memory cells in a memory cell array according to one embodiment.

FIG. 4 is a circuit diagram of the peripheral circuit of the memory cell array 1. One end of each bit line BL is connected to a column peripheral circuit 2a, which is one part of a column control circuit 2. Also, one end of each word line WL is connected to a row peripheral circuit 3a, which is one part of a row control circuit 3. With this column peripheral circuit 2a and the row peripheral circuit 3a, the voltage necessary for the operation is supplied to the bit line BL and the word line WL. It is possible to add the different functions necessary for the operation and control of the bit line BL and the word line WL to the column peripheral circuit 2a and the row peripheral circuit 3a, respectively.

Hereinafter, a case when voltage is applied so that, with respect to the memory cell MC, the bit line BL is high voltage and the word line WL is low voltage, the case may be expressed such that a positive polarity (a first polarity) voltage is applied; a case when voltage is applied so that, with respect to the memory cell MC, the bit line BL is low voltage and the word line WL is high voltage, the case may be expressed such that a negative polarity (a second polarity) voltage is applied. In this case, the voltage that is applied to the positive polarity with respect to the memory cell MC is shown as a positive voltage, and the voltage that is applied to the negative polarity with respect to the memory cell is shown as a negative voltage.

Operation of the Memory Cell

Figure 5:
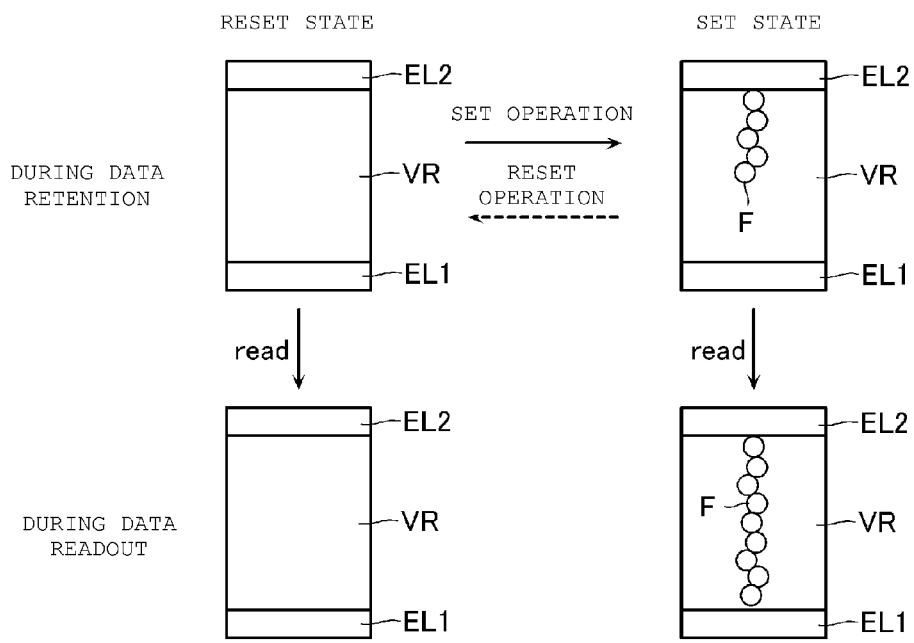
FIG. 5 is a schematic diagram that illustrates an operation method of a memory cell according to one embodiment.

FIG. 5 is a diagram that explains an operation method of the memory cell MC that includes the variable resistance elements VR.

By applying a set voltage for a set time to the variable resistance elements VR of the selected memory cell MC, the variable resistance elements VR of the selected memory cell MC are changed to a set state. This operation that changes the variable resistance elements VR to the set state is called a set operation. The set state is a state wherein part of the conductive filament F that electrically connects the electrode EL1 and electrode EL2 is disconnected.

On the other hand, by applying a reset voltage for a reset time to the variable resistance elements VR of the selected memory cell MC, the variable resistance elements VR of the selected memory cell MC are changed to the reset state that is conducted at a voltage higher than the set voltage. This operation that changes the variable resistance elements VR to the reset state is called a reset operation. The reset state is a state wherein the length of the conductive filament F is shorter than that in the set state.

During the readout operation, a readout voltage is applied to the variable resistance elements VR of the selected memory cell MC. By applying the readout voltage, the conductive filament F is extended towards the electrode E1 side if the state of the memory cell MC before applying the readout voltage is the set state. The voltage that connects the conductive filament F of the reset state is larger than that of the set state. So the conductive filament F is not extended towards the electrode E1 side by applying the readout voltage if the state of the memory cell MC is the reset state. Utilizing this difference, it is possible to read the state of the selected memory cell MC.

Figure 6:
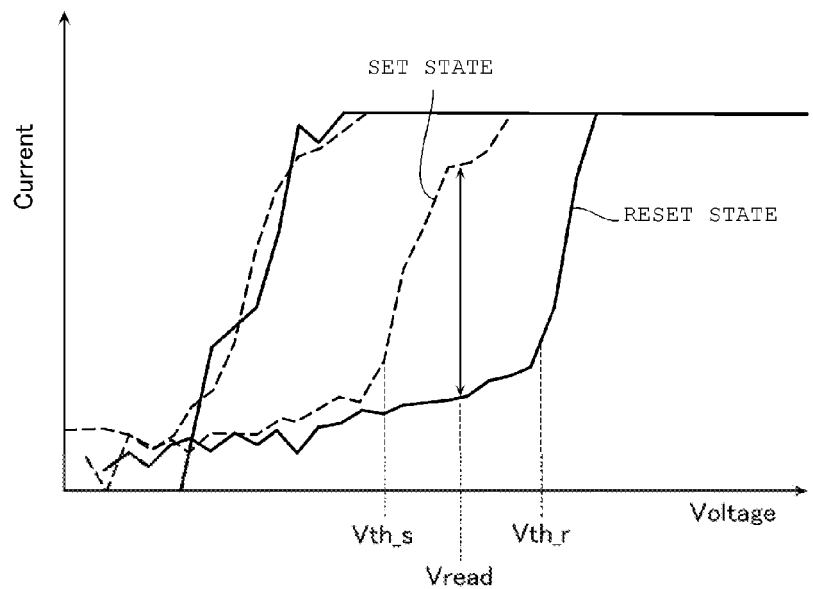
FIG. 6 is a current versus voltage diagram that illustrates data retention states of a memory cell according to one embodiment.

FIG. 6 shows the electrical characteristics of the variable resistance elements VR in the set state and the reset state. FIG. 6 is an example of a case wherein silver (Ag) is used for the electrode EL2 and silicon oxide ($SiO_x$) is used as the base material of the variable resistance elements VR. In FIG. 6, the current-voltage characteristics of the set state are shown by the dashed line, and the current-voltage characteristics of the reset state are shown by the solid line.

When the memory cell MC is in the set state, and a voltage greater than or equal to a voltage $Vth\_s$ is applied, a large amount of current is passed. On the other hand, when the memory cell MC is in the reset state, and a voltage that is greater than or equal to the voltage $Vth\_r$ is applied, a large amount of current is passed. In this case, voltage $Vth\_s$ is smaller than voltage $Vth\_r$, and if a voltage Vread that satisfies $Vth\_s \leq Vread < Vth\_r$ is considered the readout voltage, a large current differential is generated between the set state and the reset state during the application of the readout voltage Vread. Based on this current differential, the resistance state of the memory cell MC is determined and used as data.

Here, by controlling the applied voltage during the readout operation, a voltage smaller than voltage $Vth\_s$ will be applied to the half-selected memory cell MC and unselected memory cell MC during the readout operation. Accordingly, only an extremely small current will pass through the unselected or the half-selected memory cell MC, and, thus the unselected or the half-selected memory cell MC can function as a rectifying element will retain its desired memory state.

Next, a detailed explanation of the set operation and the reset operation with respect to the memory cell MC will be described.

(Set Operation)

The set operation according to the present embodiment is described with reference to FIG. 7 and FIG. 8. Here, the set operation in the present embodiment shall be an operation wherein a set voltage of a positive polarity is applied to the selected memory cell MC, and the variable resistance elements VR are changed to the set state. The set operation is described below.

Figure 7:
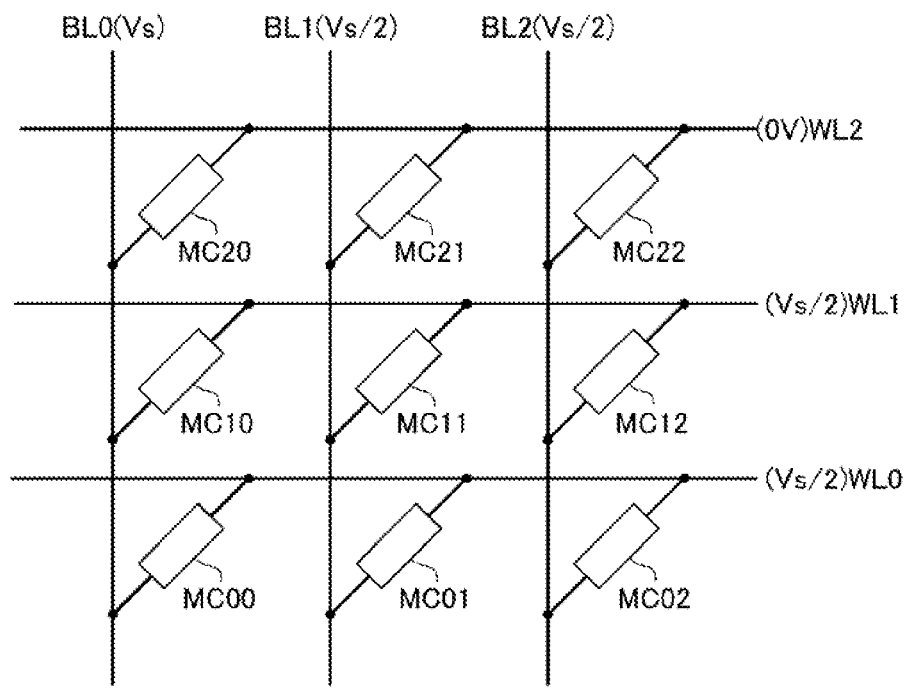
FIG. 7 is a diagram that illustrates a voltage application levels in a memory cell array during a set operation of the first embodiment.
Figure 7:
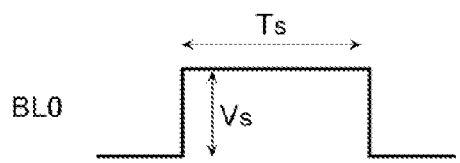
Figure 7:
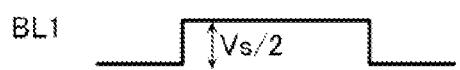
Figure 7:
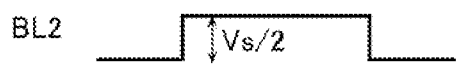
Figure 7:
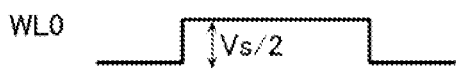
Figure 7:
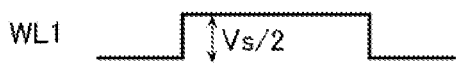
Figure 7:

FIG. 7 is a diagram that shows a voltage application state during the set operation of the present embodiment. FIG. 7 shows the voltage application state when the set operation is executed to one layer of the memory cell array 1. FIG. 8 is a waveform diagram of a voltage that is applied to the memory cell MC during the set operation of the present embodiment. In the present embodiment, an example of executing a set operation wherein the memory cell MC20 that is connected to the bit line BL0 and the word line WL2 is considered the selected memory cell MC is described. Also, memory cells MC21, MC22, MC10, and MC00 that are connected to either the selected bit line BL0 or the selected word line WL2 are called the half-selected memory cells MC, and the memory cells MC11, MC12, MC01, and MC02 that are not connected to either the selected bit line BL0 or the selected word line WL2 are called the unselected memory cells MC.

As shown in FIG. 7, a set voltage Vs that can change the variable resistance elements VR from the reset state to the set state is applied to the selected bit line BL0. The electric potential of the selected word line WL2 shall be 0 V. A voltage Vs/2, which is half of the set voltage Vs, is applied to the unselected bit lines BL1 and BL2. Also, a voltage Vs/2, which is half of the set voltage Vs, is applied to the unselected word lines WL0 and WL1. The application time of these voltages is a set voltage application time Ts. A voltage application time (a voltage pulse width) shall be the time from when a voltage which is applied to a set wire exceeds a half of a desired value to the time when the voltage falls below the half of the desired value. For example, the set voltage application time during the set operation is calculated based on the time from when the voltage of the selected bit line BL0 exceeds voltage Vs/2 to when the voltage falls below voltage Vs/2.

Figure 8:
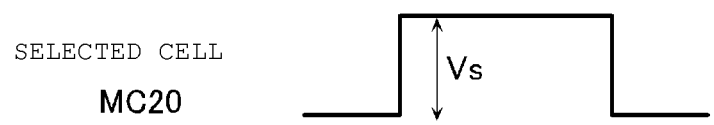
FIG. 8 is a voltage waveform diagram illustrating the voltages applied during a set operation of the first embodiment.
Figure 8:
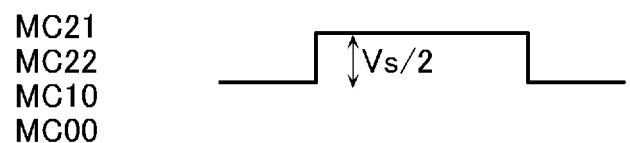
Figure 8:
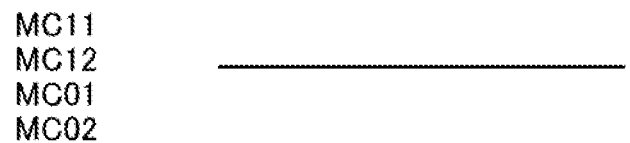

As shown in FIG. 8, with the voltage application during the set operation, a set voltage Vs of a positive polarity necessary for the set operation is applied to the selected memory cell MC20. With this, the selected memory cell MC20 has the variable resistance elements VR changed from the reset state to the set state. Also, a voltage Vs/2 of a positive polarity is applied to the half-selected memory cells MC21, MC22, MC10, and MC00. With this voltage Vs/2, since a set operation is not generated in the half-selected memory cells MC21, MC22, MC10, and MC00, the half-selected memory cells MC21, MC22, MC10, and MC00 are maintained in the same state as prior to the set operation. Since voltage is not applied to the unselected memory cells MC11, MC12, MC01, and MC02, the unselected memory cells MC11, MC12, MC01, and MC02 are maintained in the same state as prior to the set operation.

Meanwhile, to reliably execute the set operation in this semiconductor storage device, it is necessary for the voltage $Vth\_s$ and voltage $Vth\_r$ shown in FIG. 6 to have the relationship of Equation 1.

$$0.5 \times Vth\_r < Vth\_s \qquad \text{(Equation 1)}$$

The voltage Vs required for the set operation is a voltage that is required to form a conductive filament F inside of the variable resistance elements VR of the selected memory cell MC. Thus, the voltage Vs is equivalent to the voltage $Vth\_r$, because the memory cell in the reset state shown in FIG. 6 starts to conduct on the voltage $Vth\_r$.

The voltage Vs/2 (equal to the voltage Vth_r/2) is applied to the half-selected memory cells MC21, MC22, MC10, and MC00 during the set operation. When the half-selected memory cells MC21, MC22, MC10, and MC00 are in the set state, and if this voltage Vs/2 exceeds the voltage Vth_s, the half-selected memory cell MC21, MC22, MC10, and MC00 will become more conductive. Since the number of the half-selected memory cells, e.g. four cells in FIG. 7, is much larger than that of the selected memory cell, e.g. one cell in FIG. 7, undesirable current passing through the half-selected memory cells will be piled up and increase dramatically. As a result, a larger current can pass through the memory cell array, and the consumed current will be increased undesirably.

However, if the relationship of Equation 1 is satisfied, voltage Vs/2 (e.g., Vs/2 equals Vth_r/2) that is applied to the half-selected memory cells MC21, MC22, MC10, and MC00 during the set operation will not exceed the voltage Vth_s. Therefore, the half-selected memory cells MC21, MC22, MC10, and MC00 will not have their conductivity greatly altered during the set operation, and thus the set operation can be reliably executed on components in the memory cell array.

Reset Operation

The reset operation according to the present embodiment is described with reference to FIGS. 9 and 10. Here, the reset operation in the present embodiment shall be an operation wherein a reset voltage of a negative polarity is applied to the selected memory cell MC, and the variable resistance elements VR are changed to the reset state. The reset operation is described below.

Figure 9:
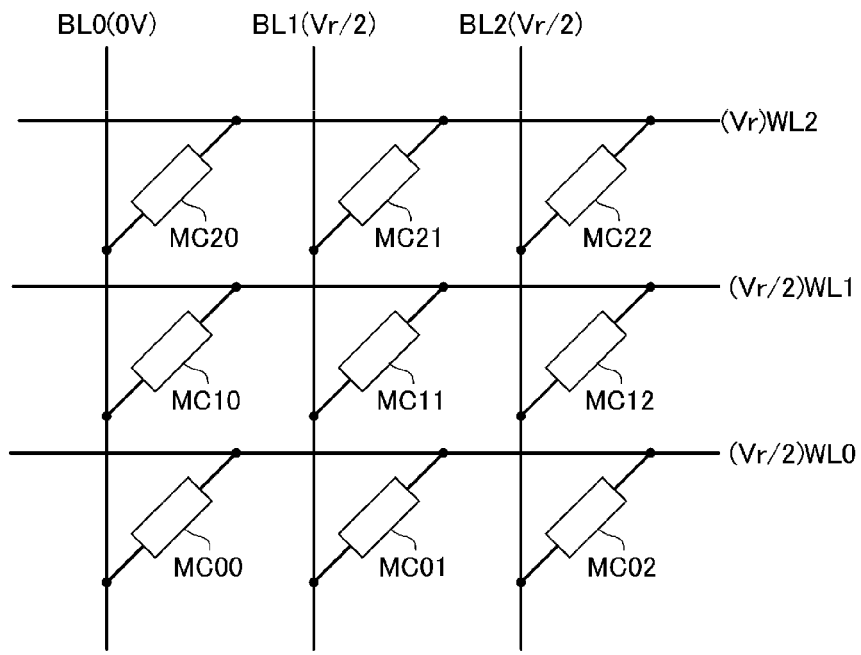
FIG. 9 is a diagram that shows a voltage application state during a reset operation of the first embodiment.
Figure 9:
Figure 9:
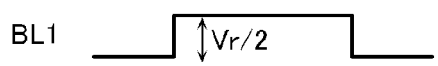
Figure 9:
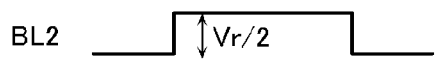
Figure 9:
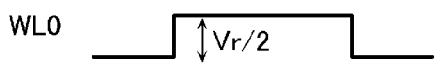
Figure 9:
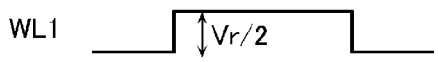
Figure 9:
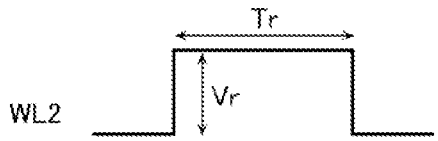

FIG. 9 is a diagram that illustrates the voltage application state during the reset operation of the present embodiment. FIG. 10 is a waveform diagram of the voltage that is applied to the memory cell MC during the reset operation of the present embodiment. In the present embodiment, an example of executing the reset operation is described, wherein the memory cell MC20 that is connected to the selected bit line BL0 and the selected word line WL2 is considered the selected memory cell MC.

As shown in FIG. 9, a reset voltage Vr that can change the variable resistance elements VR from the set state to the reset state is applied. The voltage applied to the selected word line WL2 is Vr. The electric potential of the selected bit line BL0 shall be 0 V. A voltage Vr/2, which is half of the amplitude of the reset voltage Vr, is applied to the unselected bit lines BL1 and BL2. Also, a voltage Vr/2, which is half of the amplitude of the reset voltage Vr, is applied to the unselected word lines WL0 and WL1. The application time of these voltages is a reset voltage application time Tr.

Figure 10:
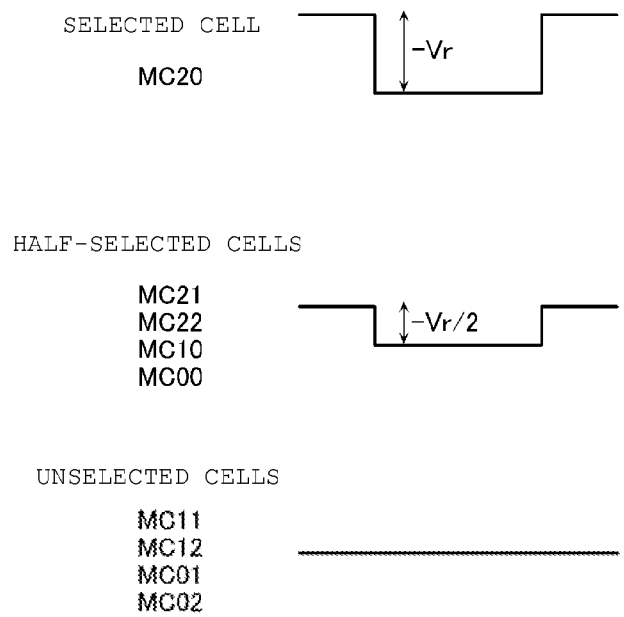
FIG. 10 is a voltage waveform diagram illustrating the voltages applied during a reset operation of the first embodiment.

As shown in FIG. 10, with the voltage application during the reset operation, a reset voltage −Vr of a negative polarity necessary for the reset operation is applied to the selected memory cell MC20. By applying the reset voltage Vr, the selected memory cell MC20 has the variable resistance elements VR changed from the set state to the reset state. Also, a voltage −Vr/2 of a negative polarity is applied to the half-selected memory cells MC21, MC22, MC10, and MC00. Since only the voltage −Vr/2 is applied, a reset operation is not generated in the half-selected memory cells MC21, MC22, MC10, and MC00. Since voltage is not applied to the unselected memory cells MC11, MC12, MC01, and MC02, the unselected memory cells MC11, MC12, MC01, and MC02 are maintained in the same state as prior to the reset operation.

Figure 11:
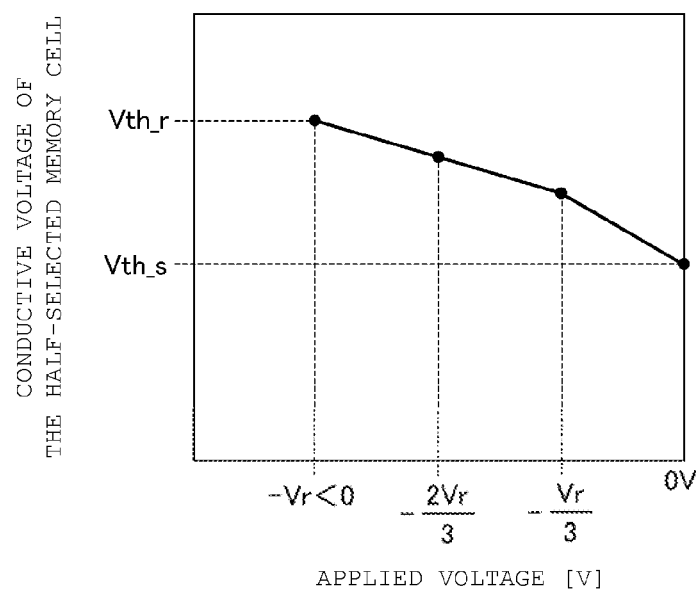
FIG. 11 is a diagram that illustrates a data retention state of a half-selected memory cell of the first embodiment.

Next, problems during the reset operation are described. FIG. 11 is a diagram that explains the data retention state of the half-selected memory cells MC during the reset operation.

During the reset operation, a voltage −Vr/2 of a negative polarity is applied to the half-selected memory cells MC21, MC22, MC10, and MC00 as described above. When this voltage −Vr/2 of a negative polarity is applied to the variable resistance elements VR in the set state, while a complete reset operation will not occur, there are cases when a slight state change occurs, or the variable resistance element VR becomes more resistive after the application of the voltage −Vr/2. The state change due to the voltage −Vr/2 of a negative polarity being applied to the variable resistance elements VR may be called a disturbance.

As shown in FIG. 11, when applying a voltage of a negative polarity to the variable resistance elements VR in the set state, the voltage at that the variable resistance elements VR conducts, threshold voltage, can be changed. When no voltage is applied to the variable resistance elements VR (the applied voltage 0 V) their threshold will not change. Also, when a reset voltage −Vr of a negative polarity is applied, a reset operation is carried out on the variable resistance elements VR that were in the set state, and the conducting voltage, the threshold voltage is increased to that of a reset state, Vth_r.

Here, even when a voltage of a negative polarity that is less than the reset voltage −Vr (for example, voltage −Vr/3 and voltage −2Vr/3) is applied to the variable resistance elements VR in the set state, the conducting voltage of the variable resistance elements VR is increased. Based on the magnitude of the negative voltage, the threshold voltage is changed from Vth_s toward Vth_r. If the threshold voltage exceeds the readout voltage Vread shown in FIG. 6, there is a concern that it will be impossible to execute the readout operation of the memory cells MC21, MC22, MC10, and MC00. In this way, when a voltage −Vr/2 of a negative polarity is applied to the variable resistance elements VR of the half-selected memory cells MC21, MC22, MC10, and MC00, a disturbance is generated.

In contrast, in the semiconductor storage device of the present embodiment, the disturbance of the variable resistance elements VR of the half-selected memory cells MC21, MC22, MC10, and MC00 is resolved by executing a cancel operation. The cancel operation according to the present embodiment is described with reference to FIGS. 12 and 13.

Cancel Operation

Here, the cancel operation in the present embodiment is an operation wherein a cancel voltage of a positive polarity is applied to the half-selected memory cells MC after the reset operation, and the disturbance of the variable resistance elements VR is resolved. When a negative polarity voltage of which the absolute value is less than the absolute value of the reset voltage −Vr is applied to the variable resistance elements VR, the conducting voltage of the variable resistance elements VR becomes higher (disturbance). By applying a cancel voltage that is a positive polarity to the variable resistance elements VR, which has received this reset type of disturbance, it is possible to lower the conducting voltage of the variable resistance elements VR. The cancel operation is described below.

Figure 12:
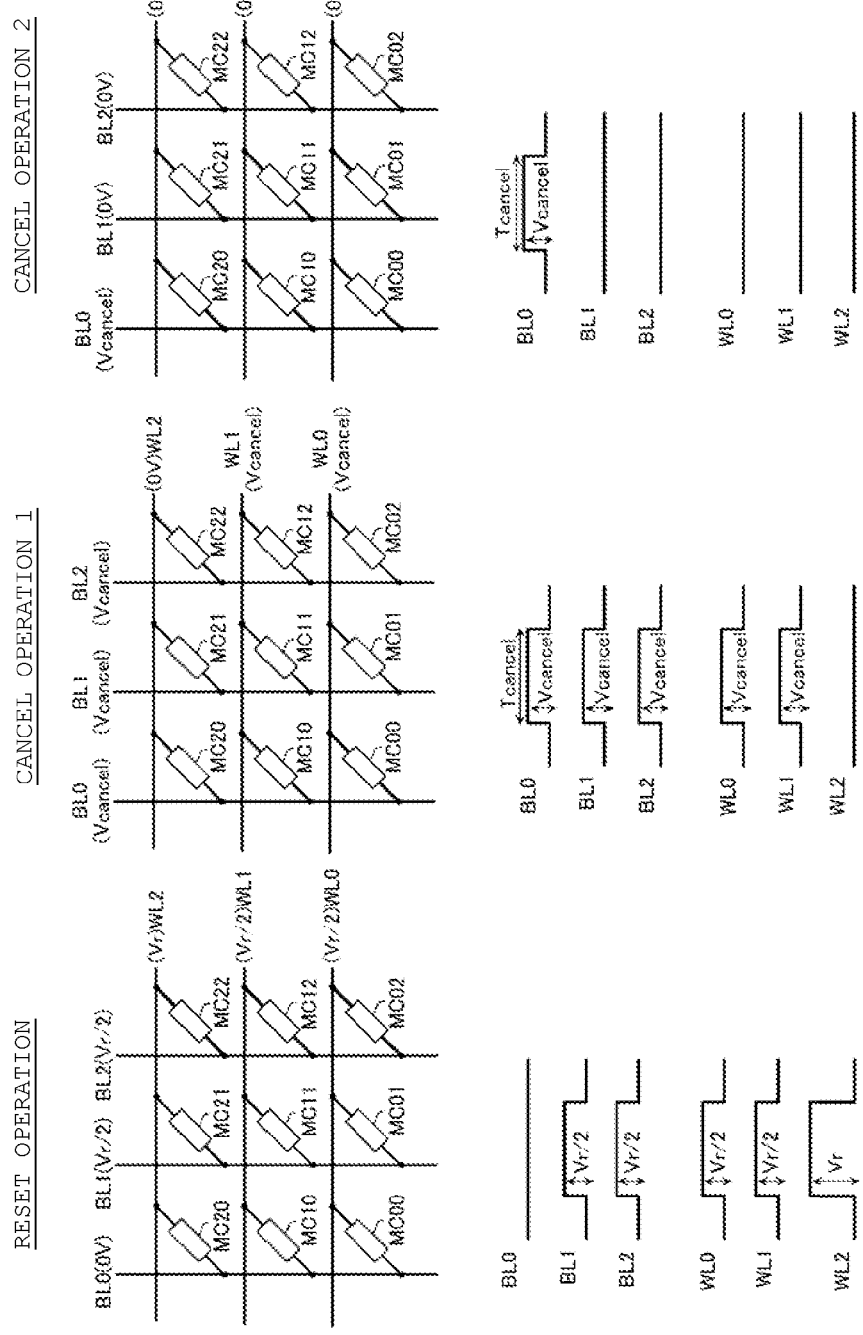
FIG. 12 is a diagram that shows a voltage application state(s) during a reset operation and a cancel operation of the first embodiment.
Figure 13:
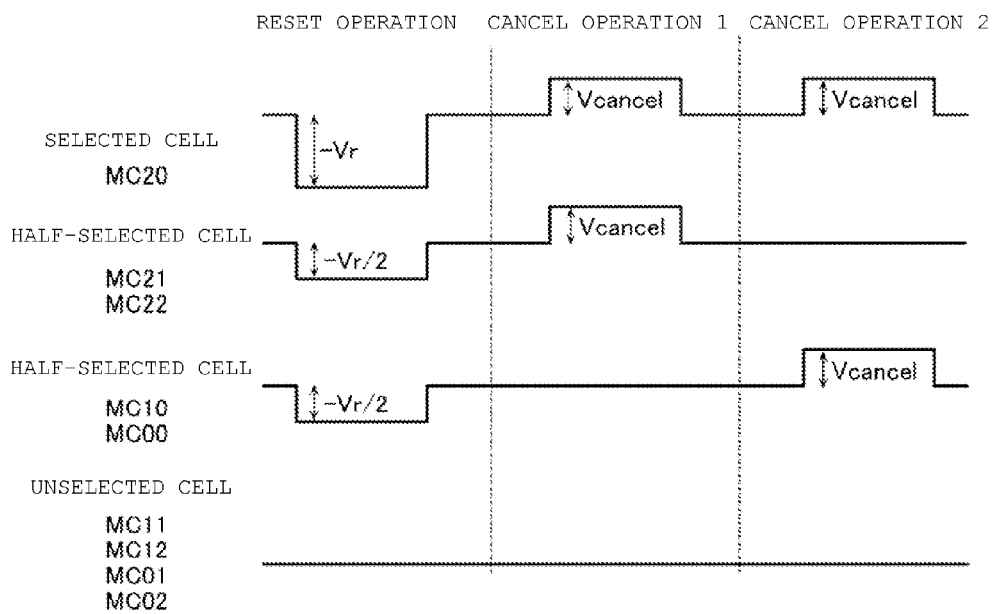
FIG. 13 is a voltage waveform diagram illustrating the voltages applied during a reset operation and a cancel operation of the first embodiment.

FIG. 12 is a diagram that shows the voltage application state during the reset operation and the cancel operation of the present embodiment. The cancel operation of the present embodiment carries out operations shown in FIG. 12 in sequence. FIG. 13 is a waveform diagram of the voltage that is applied to the memory cell MC during the reset operation and the cancel operation of the present embodiment. In the present embodiment, an example of executing the cancel operation to the half-selected memory cells MC21, MC22, MC10, and MC00 is described, wherein the memory cell MC20 that is connected to the selected bit line BL0 and the selected word line WL2 is considered the selected memory cell MC and the reset operation is executed.

Since the voltage application state during the reset operation shown in FIG. 12 is the same as the voltage application state shown in FIG. 9, the description is omitted.

In the cancel operation of the present embodiment, first, a cancel operation 1 is executed on the half-selected memory cells MC21 and MC22 to resolve the disturbance of the conducting voltage in the variable resistance elements VR. After that, a cancel operation 2 is executed on the half-selected memory cells MC10 and MC00 and resolves the disturbance of the resistance value in the variable resistance elements VR. This order may be changed arbitrarily.

As shown in FIG. 12, in the cancel operation 1, a cancel voltage Vcancel, which can resolve the disturbance of the variable resistance elements VR, is applied to the bit lines BL0, BL1 and BL2. The electric potential of the word line WL0 shall be 0 V. Also, the cancel voltage Vcancel is applied to the word lines WL1 and WL2. The application time of these voltages is a cancel voltage application time Tcancel.

As shown in FIG. 13, with the voltage application during the cancel operation 1, a cancel voltage Vcancel of a positive polarity necessary for the cancel operation is applied to the half-selected memory cells MC21 and MC22. With this, the half-selected memory cells MC21 and MC22 will have the disturbance of the variable resistance elements VR resolved. That is, the conducting voltage of the variable resistance elements VR will be similar to the normal value of conducting voltage Vth_s.

Here, a cancel voltage Vcancel of a positive polarity is applied to the selected memory cell MC20. However, even if a cancel voltage Vcancel is applied to the selected memory cell MC20 after the reset operation is completed, the reset state does not change, and there will be no adverse effects on the selected memory cell MC20. Also, since voltage is not applied to the half-selected memory cells MC10 and MC00 or the unselected memory cells MC11, MC12, MC01, and MC02, these memory cells MC will be maintained in the same state as prior to the cancel operation 1.

Next, as shown in FIG. 12, in the cancel operation 2, a cancel voltage Vcancel that is used to resolve the disturbance of a variable resistance elements VR is applied to the bit line BL0. The electric potential of the bit lines BL1 and BL2, as well as the word lines WL0, WL1, and WL2, shall be 0 V. The application time of these voltages is a cancel voltage application time Tcancel.

As shown in FIG. 13, with the voltage application during the cancel operation 2, a cancel voltage Vcancel of a positive polarity necessary for the cancel operation is applied to the half-selected memory cells MC10 and MC00. With this, the half-selected memory cells MC10 and MC00 will have the disturbance of the variable resistance elements VR resolved. That is, the conducting voltage of the variable resistance elements VR will be similar to the normal value of conducting voltage Vth_s.

Here, a cancel voltage Vcancel of a positive polarity is applied to the selected memory cell MC20. However, even if a cancel voltage Vcancel is applied to the selected memory cell MC20 after the reset operation is completed, the reset state does not change, and there will be no adverse effects on the selected memory cell MC20. Also, since voltage is not applied to the half-selected memory cells MC21 and MC22 or the unselected memory cells MC11, MC12, MC01, and MC02, these memory cells MC will be maintained in the same state as prior to the cancel operation 2.

Meanwhile, the cancel voltage Vcancel that is applied to the half-selected memory cells MC during the cancel operation is set to be a smaller value than the set voltage Vset that is applied to the selected memory cell MC during the set operation. This is because, when a memory cell MC in the reset state is included in the half-selected memory cells MC and the cancel voltage Vcancel is equal to or larger than the set voltage Vset, a set operation will erroneously be generated on the half-selected memory cells MC that were in the reset state. For this reason, the cancel voltage Vcancel that is applied to the half-selected memory cells MC during the cancel operation is set to be a value smaller than the set voltage Vset that is applied to the selected memory cell MC during the set operation.

Controlling the Cancel Voltage Value and the Cancel Voltage Application Time

In one embodiment, alongside executing the cancel operation described above, the cancel voltage value and the cancel voltage application time will be controlled. The word "value" includes a number that has a sign (e.g., positive or negative bias voltage) and a magnitude. The state change of the memory cell MC is controlled by both the voltage value and the voltage application time. In the present embodiment, the conditions of the cancel voltage value and the cancel voltage application time necessary to sufficiently resolve the fluctuation in the conducting voltage of the variable resistance elements VR that has received a disturbance will be described.

It is believed that the relationship between the voltage Vth and the time Tth necessary for the conductive filament F to extend a certain distance inside of the variable resistance element VR can be expressed as Equation 2.

$$Tth = A \times \exp\left(-\frac{K \times Vth}{t}\right) \quad \text{(Equation 2)}$$

Here, t [nanometers (nm)] is the distance between the tip of the conductive filament F and an opposing electrode. Also, the unit for the voltage Vth is volts (V), and the units for the time Tth is seconds. The unit for K is [nm/V], and the unit for A is seconds. Equation 2 shows that, when the voltage Vth (positive voltage) that is applied to the variable resistance elements VR becomes large, the time Tth necessary for the conductive filament F in the variable resistance elements VR to extend a distance to reach the opposing electrode will diminish exponentially.

Figure 14:
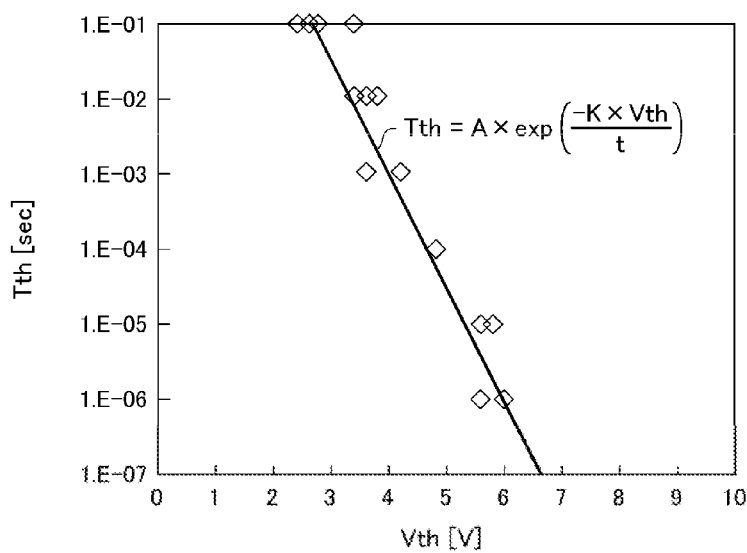
FIG. 14 is a graph that illustrates the relationship between a voltage application time and a voltage value during an operation of the first embodiment.
Figure 15:
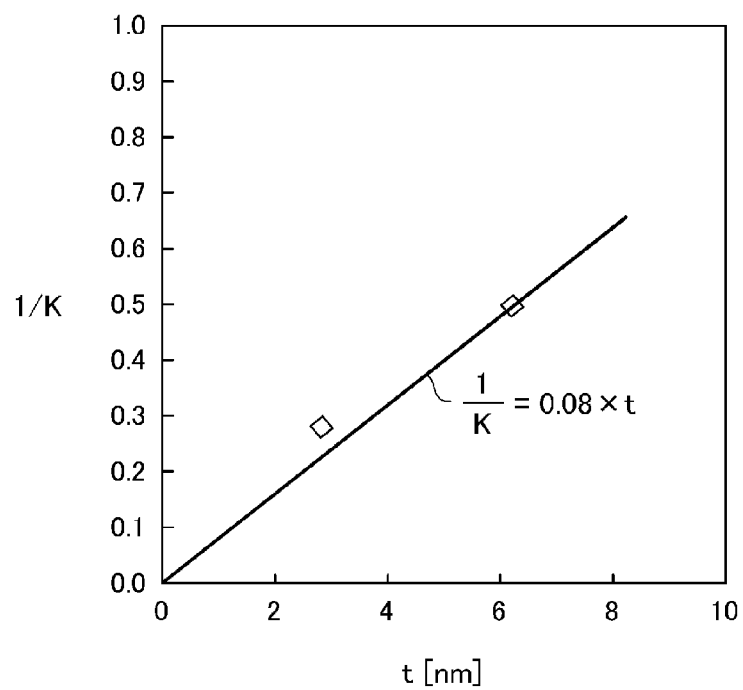
FIG. 15 is a graph that illustrates the relationship between a coefficient and a film thickness during an operation of the first embodiment.

FIG. 14 is a graph that shows the voltage Vth and the voltage application time Tth necessary for the conductive filament F to extend the film width t, when employing silicon oxide as the base material for the variable resistance elements VR having a film thickness t is set to 2.8 nm and being at a temperature of 28° C. FIG. 15 is a graph that shows the value of the coefficient K when silicon oxide is employed as the base material of the variable resistance elements VR and when the film thickness t is changed. As shown in FIG. 14, when silicon oxide is the base material of the variable resistance elements VR, Equation 2 is satisfied. Meanwhile, in one embodiment, the values for each coefficient are K=1/0.08 and A=1000.

Here, it is possible to obtain Equation 3 by transforming Equation 2.

$$t = \frac{K \times Vth}{\ln\left(\frac{A}{Tth}\right)} \quad \text{(Equation 3)}$$

Equation 3 shows that the distance t that the conductive filament F extends inside of the variable resistance elements VR is dependent on the voltage value Vth and the voltage application time Tth.

Figure 16:
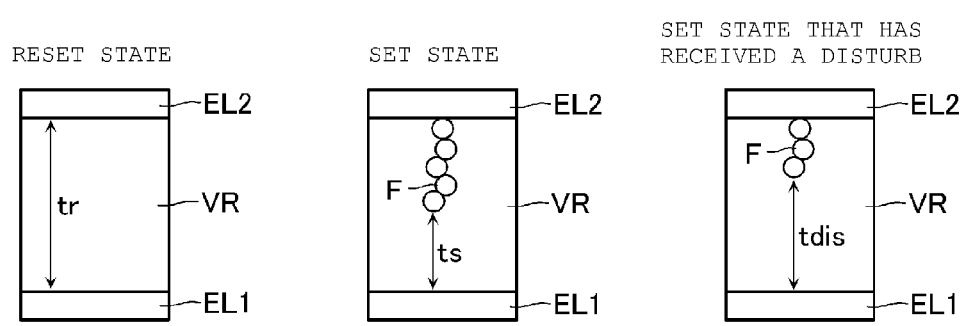
FIG. 16 is a schematic diagram that illustrates the states of a memory cell during the operation of the first embodiment.

Next, with reference to FIG. 16, the reset state, the set state, and the state when a disturbance is received in the variable resistance elements VR are described. FIG. 16 is a schematic diagram that explains each state of the memory cells MC. The distance between the tip of the conductive filament F in the variable resistance elements VR and the electrode EL1 corresponds to the distance t that the conductive filament F extends inside of the variable resistance elements VR.

When the variable resistance elements VR in the memory cell MC are in the reset state, the tip of the conductive filament F in the variable resistance elements VR and the electrode EL1 are separated by distance tr. When the variable resistance elements VR in the memory cell MC are in the set state, the tip of the conductive filament F in the variable resistance elements VR and the electrode EL1 are separated by the distance ts. A variable resistance elements VR, which is in the set state, that receives a disturbance, due to the application of a negative polarity voltage of which the absolute value is less than the absolute value of the reset voltage −Vr, will include a conductive filament F that has a gap between the tip of the conductive filament F and the electrode EL1 that is equal to a distance tdis.

Here, as is clear from FIG. 16, the distance tr and the distance tdis are in the relationship shown in Equation 4.

$$tdis > ts \quad \text{(Equation 4)}$$

The voltage Vth that the memory cell MC shown in FIG. 6 conducts (voltage Vth_s if in the set state, and voltage Vth_r if in the reset state) and the distance between the conductive filament F and the electrode EL1 shown in FIG. 16 are correlated. For this reason, the relationship of the voltage Vth is converted to the relationship of the distance between the conductive filament F and the electrode EL1. Equation 5 is derived from Equation 1 and Equation 3.

$$tdis > 0.5 \times tr \quad \text{(Equation 5)}$$

From Equation 3 and Equation 5, the conditions of the voltage (voltage value Vth_r and time Tth r) necessary to connect the conductive filament F to the electrode EL1 that were originally in the reset state, and the conditions of the voltage (voltage value Vth_dis and time Tth_dis) necessary to carry out the cancel operation to reconnect the conductive filament F and the electrode EL1 in a state wherein a disturbance is received have the relationship shown in Equation 6. Here, when silicon oxide is employed as the base material for the variable resistance elements VR, the value of A is a constant, which may equal 1000.

$$-\frac{Vth\_r}{\ln\left(\frac{Tth\_r}{A}\right)} > -\frac{2Vth\_dis}{\ln\left(\frac{Tth\_dis}{A}\right)} \quad \text{(Equation 6)}$$

The voltage Vth_r and the voltage application time Tth r necessary to connect the conductive filament F to the electrode EL1 that were originally in the reset state are equivalent to the set voltage Vs and the voltage application time Ts of a positive polarity that are applied to the selected memory cell MC during the set operation. Also, in a state wherein a disturbance is received, the voltage Vth_dis and the voltage application time Tth_dis necessary to carry out the cancel operation to reconnect the conductive filament F to the electrode EL1 are equivalent to the cancel voltage Vcancel and the voltage application time Tcancel that are applied to the half-selected memory cells MC during the cancel operation.

That is, the value of the cancel voltage Vcancel and the voltage application time Tcancel during the cancel operation and the value of the set voltage Vset and the voltage application time Tset during the set operation must be in the relationship shown in Equation 7.

$$-\frac{Vs}{\ln\left(\frac{Ts}{A}\right)} > -\frac{2Vcancel}{\ln\left(\frac{Tcancel}{A}\right)} \quad \text{(Equation 7)}$$

Effects

In the semiconductor storage device according to the present embodiment, a set operation, a reset operation, and a cancel operation are carried out. With this, due to the voltage application during the cancel operation, a cancel voltage Vcancel of a positive polarity is applied to the half-selected memory cells MC. From this, a disturbance created during a reset operation in variable resistance elements VR of half-selected memory cells MC is resolved. Also, when executing the set operation and the cancel operation, they are executed so that the value of the cancel voltage Vcancel and the voltage application time Tcancel and the value of the set voltage Vset and the voltage application time Tset satisfy the relationship of Equation 7. With this, even when carrying out an operation to the memory cell array 1 after the cancel operation, the operation can be reliably carried out.

Figure 17:
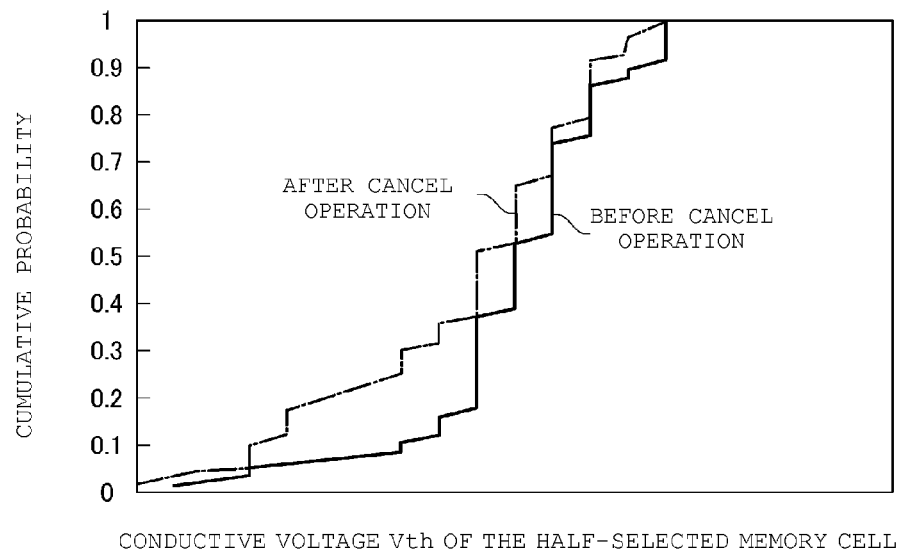
FIG. 17 is a graph that illustrates the effects of an operation of the first embodiment.

FIG. 17 is a graph that shows the effects when the cancel operation of the present embodiment is carried out. In FIG. 17, the voltage Vth that the half-selected memory cells MC conduct before the cancel operation and after the cancel operation and the cumulative probability that represents the number of the half-selected memory cells MC that have a certain conducting voltage Vth. As shown in FIG. 17, after executing the cancel operation, the memory cells that conduct at a low voltage Vth have increased in number. This indicates that it is possible to lower the conducting voltage of the variable resistance elements VR to around the normal conducting voltage Vth_s.

In this way, by carrying out the cancel operation and, at the same time, carrying out the operation so that the value of the cancel voltage Vcancel and the voltage application time Tcancel and the value of the set voltage Vset and the voltage application time Tset satisfy the relationship of Equation 7, the disturbance of the variable resistance elements VR of the half-selected memory cells MC is resolved. That is, it becomes possible to suppress the fluctuation in the resistance state of the memory cell MC that is caused by the reset operation.

Another Example of First Embodiment

In the first embodiment, an example was shown where silicon oxide is used as the base material of the variable resistance elements VR. The descriptions can also be applied if silicon is used as the base material of the variable resistance elements VR.

Recently, inventors found that, when silicon is employed as the base material of the variable resistance elements VR, the relationship between the voltage Vth and the time Tth necessary for the conductive filament F to extend a set distance in the variable resistance elements VR can be represented by Equation 8.

$$Tth = A \times \exp\left(-\frac{K \times Vth}{t}\right) \quad \text{(Equation 8)}$$

Here, t [nm] is the distance between the tip of the conductive filament F and an opposing electrode. Also, the unit for the voltage Vth is Volts, and the unit for the time Tth is seconds. The unit for K is nanometers per Volt [nm/V], and the unit for A is seconds.

Figure 18:
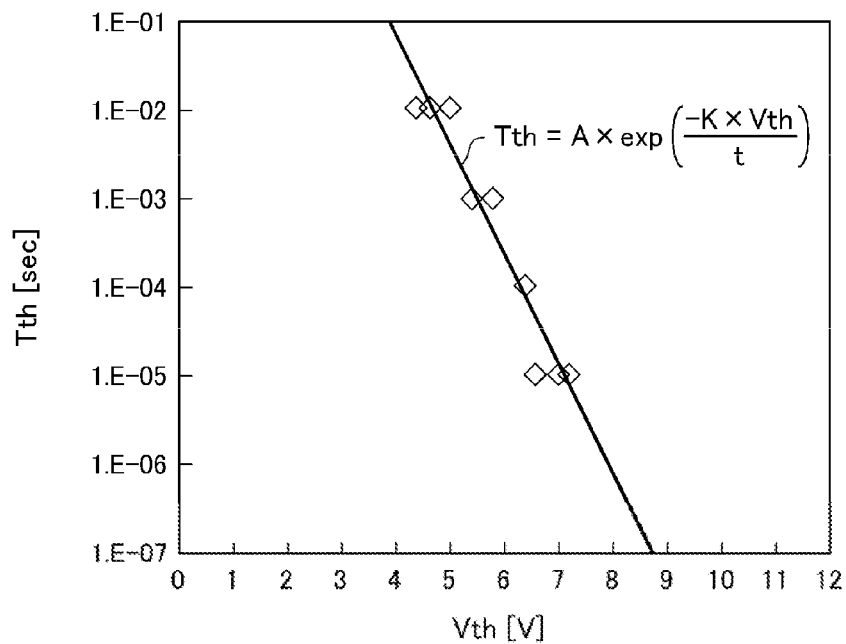
FIG. 18 is a graph that illustrates a relationship between a voltage application time and a voltage value during an operation of another example.
Figure 19:
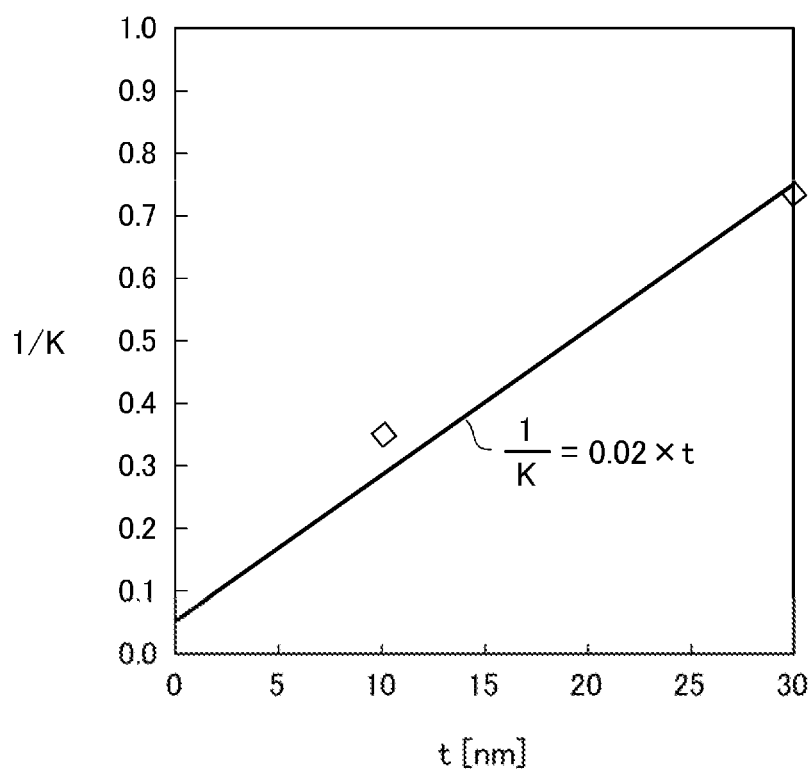
FIG. 19 is a graph that illustrates a relationship between a coefficient and a film thickness during an operation of another example.

FIG. 18 is a graph that shows the voltage Vth and the voltage application time Tth necessary for the conductive filament F to extend the film width t when employing silicon as the base material for the variable resistance elements VR. In this example, the film thickness t was set to 10 nm and the temperature was set to 28° C. FIG. 19 is a graph that shows the value of the coefficient K when silicon is employed as the base material of the variable resistance elements VR versus film thickness t. As shown in FIG. 18, when silicon is used as the base material of the variable resistance elements VR, Equation 8 is satisfied. Meanwhile, in one embodiment, the values for each coefficient are K=1/0.02 and A=6100.

In this case, like the first embodiment, the value of the cancel voltage Vcancel and the voltage application time Tcancel during the cancel operation and the value of the set voltage Vset and the voltage application time Tset during the set operation must be in the relationship shown in Equation 9.

$$-\frac{Vs}{\ln\left(\frac{Ts}{A}\right)} > -\frac{2Vcancel}{\ln\left(\frac{Tcancel}{A}\right)} \quad \text{(Equation 9)}$$

Effects

When silicon is employed as the base material of the variable resistance elements VR, the cancel operation is carried out so that the value of the cancel voltage Vcancel and the voltage application time Tcancel and the value of the set voltage Vset and the voltage application time Tset satisfy the relationship of Equation 9. From this, the disturbance of the variable resistance elements VR of the half-selected memory cells MC is resolved. That is, it becomes possible to suppress the fluctuation in the resistance state of the memory cell MC that is caused by the reset operation.

Second Embodiment

Next, the second embodiment of the present invention is described with reference to FIGS. 20 to 22. The overall composition of the semiconductor storage device of the present embodiment is the same as the first embodiment, and the detailed description is omitted. Also, parts that have the same configuration as the first embodiment will be given the same reference symbols, and the redundant descriptions will be omitted. In the second embodiment, the cancel operation includes applying a weak negative polarity voltage after applying a cancel voltage Vcancel having a positive polarity.

Operation of the Present Embodiment

The set operation of the present embodiment applies a set voltage Vs of a positive polarity that can connect the conductive filament F to the electrode EL1 in variable resistance elements VR that were originally in the reset state. Subsequently, a negative polarity voltage is applied to partially disconnect the conductive filament F, and the set state shown in FIG. 5 is achieved.

In the cancel operation of the present embodiment, like the set operation, a cancel voltage Vcancel of a positive polarity, which can connect the conductive filament F to the electrode EL1, is applied to the variable resistance elements VR that have received a disturbance. After that, a negative polarity voltage is applied to at least partially disconnect the conductive filament F. The cancel operation and the negative voltage applied operation according to the present embodiment are described with reference to FIGS. 20 to 22.

Figure 20:
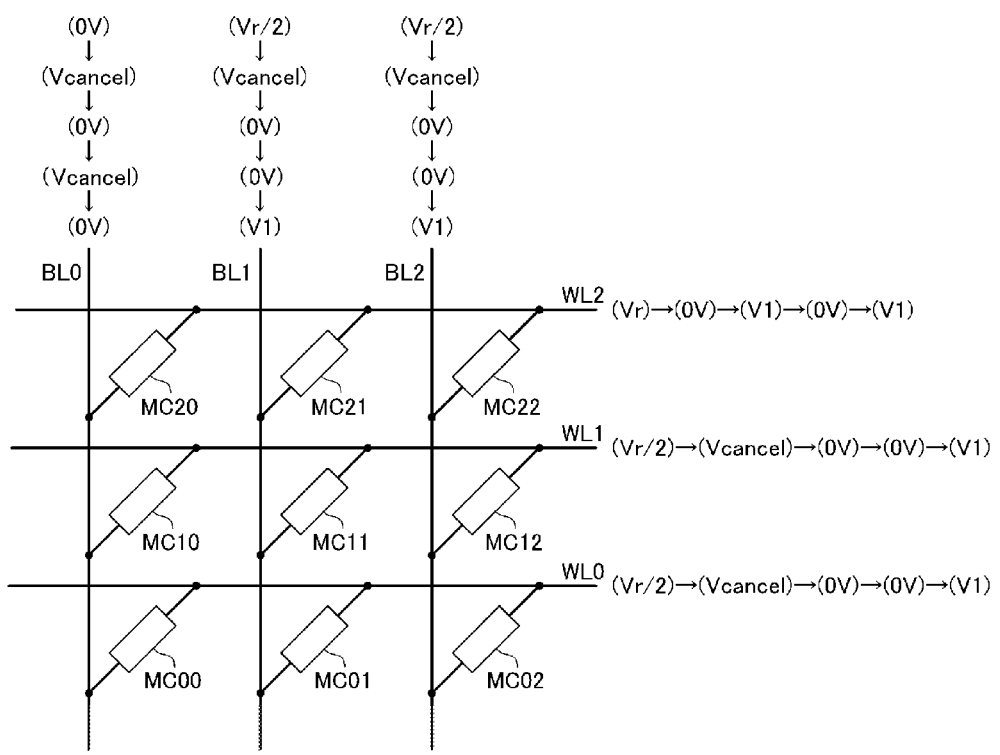
FIG. 20 is a diagram that illustrates the voltage application states during a reset operation, a cancel operation, and a negative voltage applied operation of a second embodiment.
Figure 21:
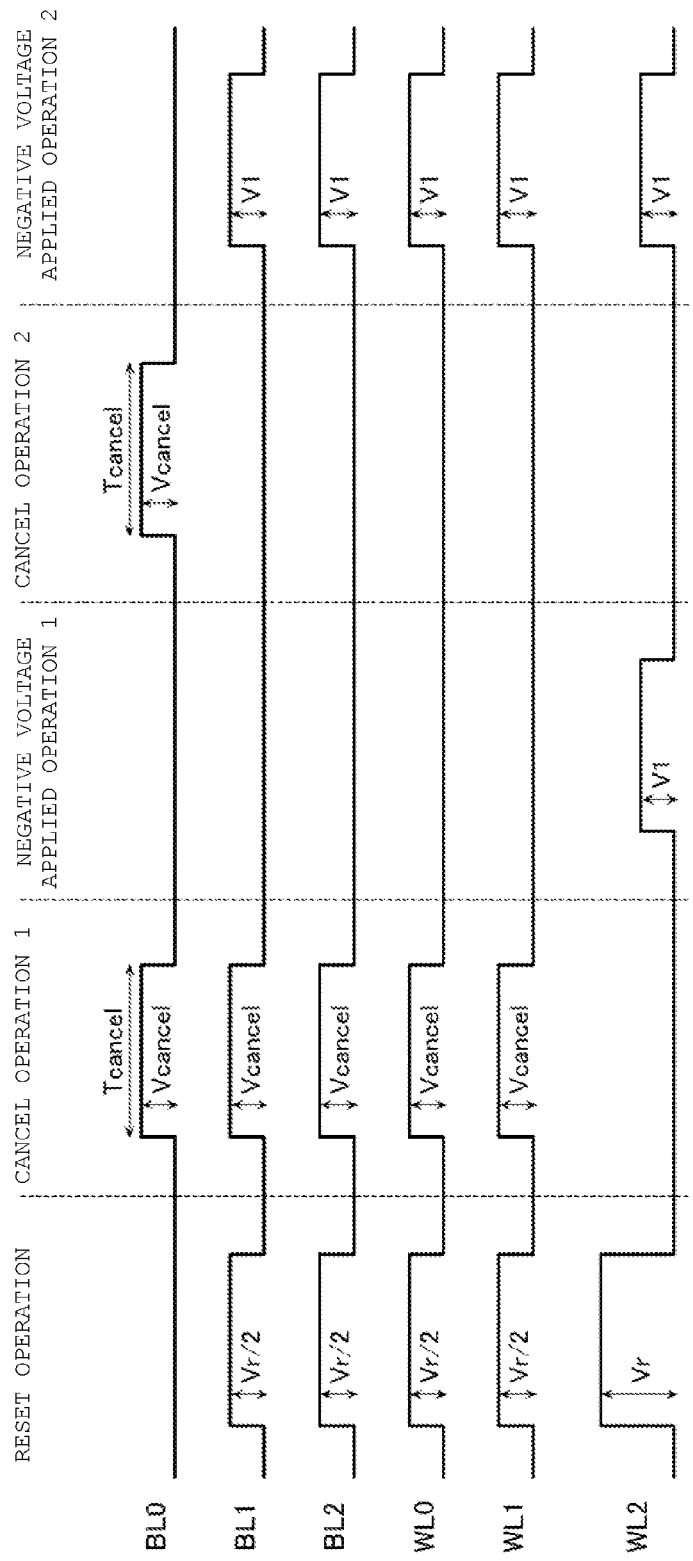
FIG. 21 is a diagram that illustrates the voltage application states during a reset operation, a cancel operation, and a negative voltage applied operation of the second embodiment.

FIGS. 20 and 21 are diagrams that show the voltage application state during the reset operation, the cancel operation, and the negative voltage applied operation of the present embodiment. The negative voltage applied operation of the present embodiment is carried out after each of cancel operations 1 and 2. FIG. 22 is a waveform diagram of the voltage that is applied to the memory cell MC during the reset operation, the cancel operation, and the negative voltage applied operation of the present embodiment. In the present embodiment, description is made for an example of executing the cancel operation to the half-selected memory cells MC21, MC22, MC10, and MC00, wherein the memory cell MC20 that is connected to the selected bit line BL0 and the selected word line WL2 is considered the selected memory cell MC and the reset operation is executed.

Since the voltage application state during the reset operation and the cancel operation is the same as the reset voltage application state shown in FIG. 12, the description is omitted.

In the present embodiment, after executing the cancel operation 1 on the half-selected memory cells MC21 and MC22, a negative voltage applied operation 1 is conducted on the half-selected memory cells MC21 and MC22. Also, after executing the cancel operation 2 on the half-selected memory cells MC10 and MC00, a negative voltage applied operation 2 is conducted on the half-selected memory cells MC10 and MC00. The timing of the negative voltage applied operation, if executed after the cancel operation is carried out, can be arbitrarily changed.

As shown in FIGS. 20 and 21, in the negative voltage applied operation 1, a weak reset voltage V1 is applied to the word line WL2. The electric potential of the bit lines BL0, BL1, and BL2, as well as the word lines WL0 and WL1, shall be 0V.

Figure 22:
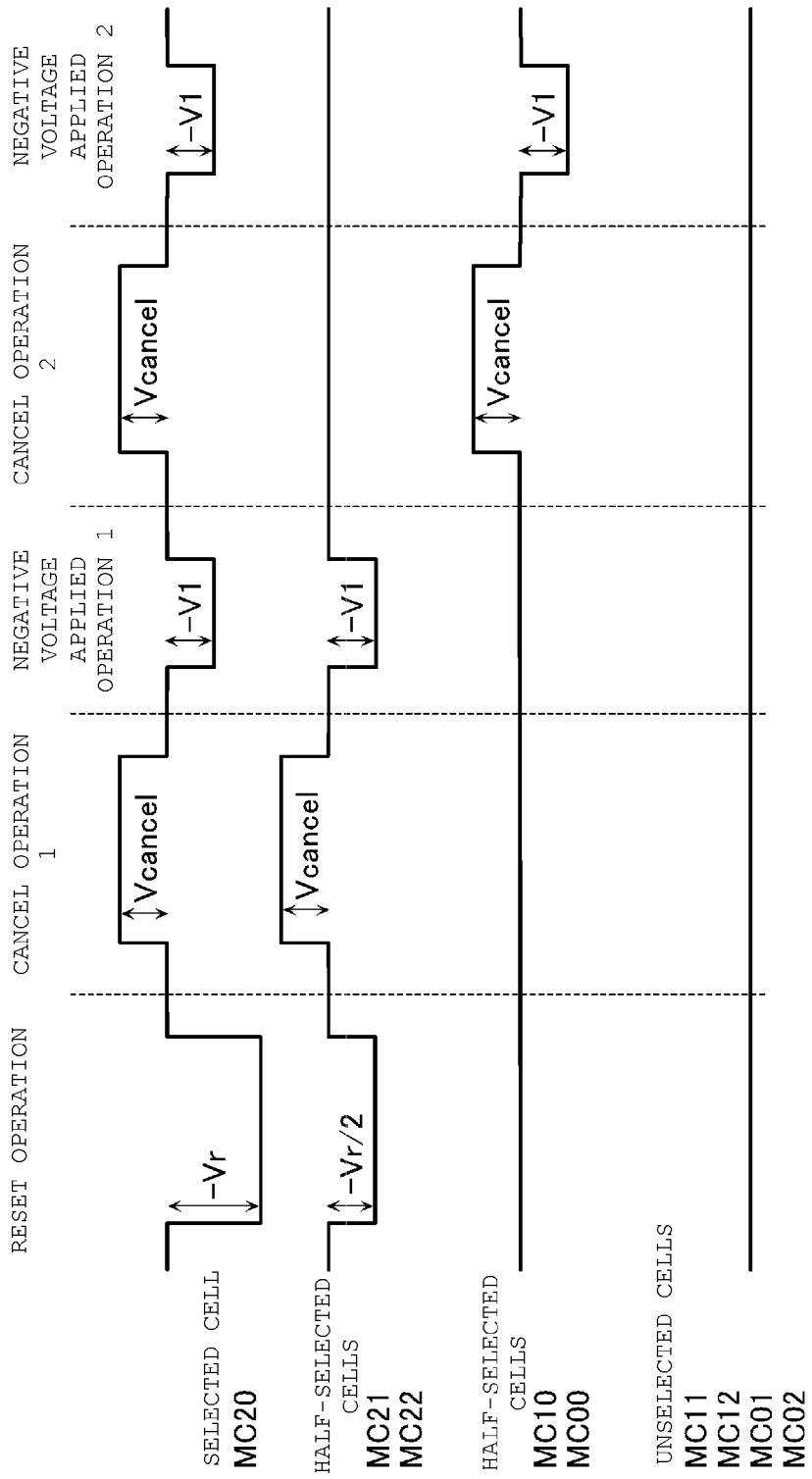
FIG. 22 is a voltage waveform diagram during a reset operation, a cancel operation, and a negative voltage applied operation of the second embodiment.

As shown in FIG. 22, with the voltage application during the negative voltage applied operation 1, a weak reset voltage V1 of a negative polarity is applied to the half-selected memory cells MC21 and MC22. With this, in the half-selected memory cells MC21 and MC22, part of the conductive filament F that extends to connect to the electrode EL1 is disconnected by the negative voltage applied operation 1. That is, the variable resistance elements VR can be changed to the set state shown in FIG. 5.

Here, a weak reset voltage V1 of a negative polarity is applied to the selected memory cell MC20. However, the reset operation has been carried out on the selected memory cell MC20, and even if a weak reset voltage V1 is applied, there is no adverse effect to memory cell MC20. Also, since a voltage is not applied to the half-selected memory cells MC10 and MC00 or to the unselected memory cells MC11, MC12, MC01, and MC02, these memory cells MC are maintained in the same state as prior to the negative voltage applied operation 1.

Also, as shown in FIGS. 20 and 21, in the negative voltage applied operation 2, a weak reset voltage V1 is applied to the bit lines BL1 and BL2, as well as to the word lines WL0, WL1, and WL2. The electric potential of the bit line BL0 shall be 0V.

As shown in FIG. 22, with the voltage application during the negative voltage applied operation 2, a weak reset voltage V1 of a negative polarity is applied to the half-selected memory cells MC10 and MC00. With this, in the half-selected memory cells MC10 and MC00, part of the conductive filament F that extends to connect to the electrode EL1 is disconnected by the negative voltage applied operation 2. That is, the variable resistance elements VR can be changed to the set state shown in FIG. 5.

Here, a weak reset voltage V1 of a negative polarity is applied to the selected memory cell MC20. However, the reset operation has been carried out on the selected memory cell MC20, and even if a weak reset voltage V1 is applied, there is no adverse effect. Also, since a voltage is not applied to the half-selected memory cells MC10 and MC00 or to the unselected memory cells MC11, MC12, MC01, and MC02, these memory cells MC are maintained in the same state as prior to the negative voltage applied operation 2.

Meanwhile, the weak reset voltage V1 that is applied to the half-selected memory cells MC must maintain the half-selected memory cells MC in the set state. For this reason, at least either the value of the weak reset voltage V1 or the voltage application time is set to be smaller than the value of the reset voltage Vr that is applied to the selected memory cell MC during the reset operation or the voltage application time.

Effects

In the semiconductor storage device according to the present embodiment, a negative voltage applied operation is executed on the half-selected memory cells MC after the cancel operation. With this, the half-selected memory cells MC after the cancel operation can be reliably set to the desired set state.

Also, even in this case, the cancel operation is carried out so that the value of the cancel voltage Vcancel and the voltage application time Tcancel and the value of the set voltage Vset and the voltage application time Tset satisfy the relationship of Equation 7 or Equation 9. With this, due to the voltage application during the cancel operation, a cancel voltage Vcancel of a positive polarity that is necessary for the cancel operation is applied to the half-selected memory cells MC. From this, the disturbance of the variable resistance elements VR of the half-selected memory cells MC is resolved. That is, it becomes possible to suppress the fluctuation in the resistance state of the memory cell MC that is caused by the reset operation.

Third Embodiment

Next, the third embodiment of the present invention is described with reference to FIG. 23. The overall composition of the semiconductor storage device of the present embodiment is the same as the first embodiment, and the detailed description is omitted. Also, parts that have the same configuration as the first embodiment will be given the same reference symbols, and the redundant descriptions will be omitted. In the third embodiment, the control of the voltage that is applied to the bit line BL and the word line WL during the cancel operation differs from the first and the second embodiments.

Cancel Operation

The cancel operation in the present embodiment is an operation wherein a cancel voltage of a positive polarity is applied to the half-selected memory cells MC after the reset operation, and the disturbance of the variable resistance elements VR is resolved. Here, in the present embodiment, control is carried out so that the voltages of the unselected bit lines BL1 and BL2, as well as of the unselected word lines WL0 and WL1, do not change between the reset operation and the cancel operation. The cancel operation of the present embodiment is described below.

Figure 23:
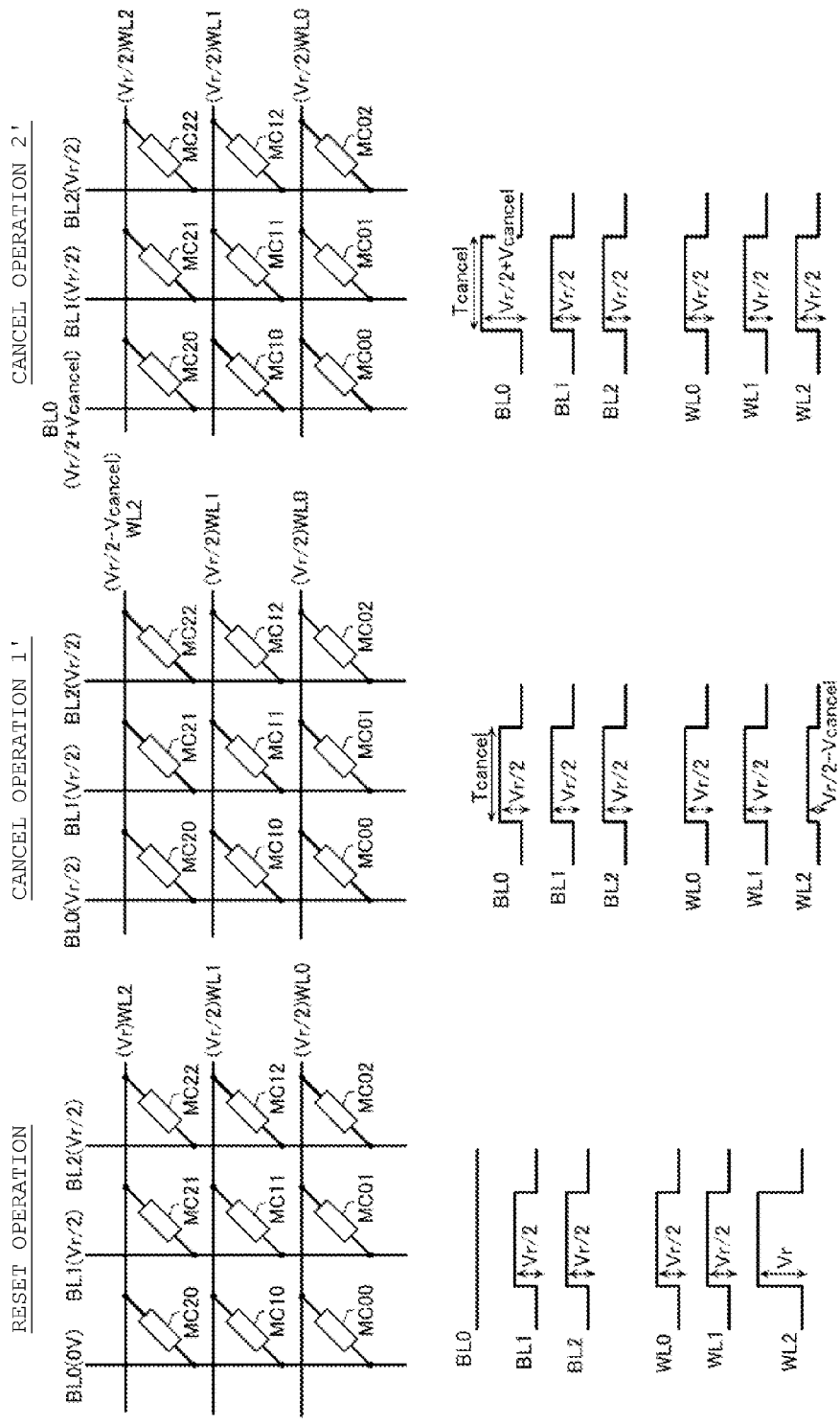
FIG. 23 is a diagram that illustrates a voltage application state during a reset operation and a cancel operation of a third embodiment.

FIG. 23 is a diagram that shows the voltage application state during the reset operation and the cancel operation of the present embodiment. The cancel operation of the present embodiment carries out the operations shown in FIG. 23 in sequence.

Since the voltage application state during the reset operation shown in FIG. 23 is the same as the voltage application state shown in FIG. 12, the description is omitted.

In the cancel operation of the present embodiment, first, a cancel operation 1' is executed on the half-selected memory cells MC21 and MC22 to resolve the disturbance of the variable resistance elements VR. After that, a cancel operation 2' is executed on the half-selected memory cells MC10 and MC00 to resolve the disturbance of the variable resistance elements VR. This order may be changed arbitrarily.

As shown in FIG. 23, in the cancel operation 1', a voltage Vr/2 is applied to the bit lines BL0, BL1, and BL2. A voltage Vr/2-Vcancel is applied to the word line WL2. Also, a voltage Vr/2 is applied to the word lines WL0 and WL1. The application time of these voltages is a cancel voltage application time Tcancel.

Further, as shown in FIG. 23, in the cancel operation 2', a voltage Vr/2+Vcancel is applied to the bit line BL0. A voltage Vr/2 is applied to the bit lines BL1 and BL2, as well as to the word lines WL0, WL1, and WL2. The application time of these voltages is the cancel voltage application time Tcancel.

Even when a cancel operation shown in FIG. 23 is executed, a cancel voltage Vcancel of a positive polarity is applied to the half-selected memory cells MC. The waveform diagram of the voltage that is applied to the memory cell MC during the reset operation and the cancel operation of the present embodiment becomes the same as that shown in FIG. 13. From this, the disturbance of the variable resistance elements VR of the half-selected memory cells MC is resolved. That is, the conducting voltage of the variable resistance elements VR can be lowered to around the normal voltage Vth_s.

Effects

In the semiconductor storage device according to the present embodiment, the bit lines BL1 and BL2, as well as the word lines WL0 and WL1 that become unselected during the reset operation, are fixed at the same voltage −Vr/2 during both the reset operation and the cancel operation. In a large-scale memory cell array 1, the numbers of unselected bit lines BL and the unselected word lines WL become extremely large. By fixing the voltage of this unselected bit line BL and unselected word line WL across the entirety of the reset operation and the cancel operation, control of the voltage necessary for the operations becomes easy.

Also, even in this case, control is carried out so that the value of the cancel voltage Vcancel and the voltage application time Tcancel and the value of the set voltage Vset and the voltage application time Tset satisfy the relationship of Equation 7 or Equation 9. Consequently, due to the voltage application during the cancel operation, a cancel voltage Vcancel of a positive polarity that is necessary for the cancel operation is applied to the half-selected memory cells MC. As a result, the disturbance of the variable resistance elements VR of the half-selected memory cells MC is resolved. That is, it becomes possible to suppress the fluctuation in the resistance state of the memory cell MC that is caused by the reset operation.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:
   a plurality of memory cells that each comprise a variable resistance element;
   a plurality of first wires and a plurality of second wires, wherein each memory cell is disposed between and electrically coupled to one of the plurality of first wires and one of the plurality of second wires; and
   a control circuit that is configured to:
      apply a set voltage ($V_s$) having a first polarity for a set voltage application time ($T_s$) to a first memory cell during a set operation in which the variable resistance element is changed to a set state having a first threshold voltage in the first polarity;
      apply a reset voltage having a second polarity being opposite to the first polarity to the first memory cell during a reset operation in which the variable resistance element is changed to a reset state having a second threshold voltage larger than the first threshold voltage in the first polarity; and
      apply a cancel voltage ($V_{cancel}$) having the first polarity for a cancel voltage application time ($T_{cancel}$) to a second memory cell in the reset operation, wherein the second memory cell is applied a certain voltage when the reset voltage is applied to the first memory cell, the absolute value of the certain voltage is less than the absolute value of the reset voltage,
   wherein the relationship between the set voltage ($V_s$), the set voltage application time ($T_s$), the cancel voltage ($V_{cancel}$) and the cancel voltage application time ($T_{cancel}$) satisfies, $$-\frac{Vs}{\ln\left(\frac{Ts}{A}\right)} > -\frac{2Vcancel}{\ln\left(\frac{Tcancel}{A}\right)},$$

wherein A is a constant.

2. The semiconductor storage device of claim 1, wherein the variable resistance element in the first memory cell and the second memory cell each comprise silicon oxide.

3. The semiconductor storage device of claim 2, wherein A equals 1000.

4. The semiconductor storage device of claim 1, wherein the variable resistance element in the first memory cell and the second memory cell each comprise silicon.

5. The semiconductor storage device of claim 4, wherein A equals 6100.

6. The semiconductor storage device of claim 1, wherein the reset voltage is applied for a first period of time, and the control circuit is further configured to apply a weak reset voltage of the second polarity to the second memory cell for a second period of time, and the absolute value of the weak reset voltage value is smaller than the absolute value of the reset voltage or the second period of time is smaller than the first period of time.

7. The semiconductor storage device of claim 1, wherein the absolute value of the cancel voltage is smaller than the absolute value of the set voltage.

8. The semiconductor storage device according to claim 1, wherein
   the applying the reset voltage to the first memory cell during the reset operation further comprises:
      applying a first reset voltage to a selected first wire;
      applying a second reset voltage to a selected second wire; and
      applying a third reset voltage to unselected first wires and unselected second wires, and
   the applying the cancel voltage ($V_{cancel}$) further comprises:
      applying a first cancel voltage to the selected first wire;
      applying a second cancel voltage to the selected second wire; and
      applying a third cancel voltage to the unselected first wires and the unselected second wires, and
   wherein the third reset voltage and the third cancel voltage have the same voltage values.

9. The semiconductor storage device of claim 1, wherein the absolute value of the cancel voltage ($V_{cancel}$) is about one half of the absolute value of the reset voltage.

10. The semiconductor storage device of claim 1, wherein the control circuit is configured to apply another voltage having the second polarity to the first memory cell during the reset operation.

11. A method of using a semiconductor storage device having a plurality of memory cells that each comprise a variable resistance element, a plurality of first wires and a plurality of second wires, wherein each memory cell is disposed between and electrically coupled to one of the plurality of first wires and one of the plurality of second wires, and a control circuit, said method comprising:
   applying a set voltage ($V_s$) having a first polarity for a set voltage application time ($T_s$) to a first memory cell during a set operation in which the variable resistance element is changed to a set state that conduct at a first voltage in the first polarity;
   applying a reset voltage having a second polarity which is opposite to the first polarity to the first memory cell during a reset operation in which the variable resistance element is changed to a reset state that conducts at a second voltage which is larger than the first voltage in the first polarity; and
   applying a cancel voltage ($V_{cancel}$) being the first polarity for a cancel voltage application time ($T_{cancel}$) to a second memory cell in the reset operation, wherein the second memory cell is applied a certain voltage when the reset voltage is applied to the first memory cell, the absolute value of the certain voltage being less than the absolute value of the reset voltage, wherein the relationship between the set voltage ($V_s$), the set voltage application time ($T_s$), the cancel voltage ($V_{cancel}$) and the cancel voltage application time ($T_{cancel}$) satisfies, $$-\frac{V_s}{\ln\left(\frac{T_s}{A}\right)} > -\frac{2V_{cancel}}{\ln\left(\frac{T_{cancel}}{A}\right)},$$

and wherein A is a constant.

12. The method of claim 11, wherein the variable resistance element in the first memory cell and the second memory cell each comprise silicon oxide.

13. The method of claim 12, wherein A equals 1000.

14. The method of claim 11, wherein the variable resistance element in the first memory cell and the second memory cell each comprise silicon.

15. The method of claim 14, wherein A equals 6100.

16. The method of claim 11, wherein the reset voltage is applied for a first period of time, and the method further comprises:
applying a weak reset voltage of the second polarity to the second memory cell for a second period of time, and the absolute value of the weak reset voltage value is smaller than the absolute value of the reset voltage or the second period of time is smaller than the first period of time.

17. The method of claim 11, wherein the absolute value of the cancel voltage is smaller than the absolute value of the set voltage.

18. The method of claim 11, wherein the absolute value of the cancel voltage ($V_{cancel}$) is about one half of the absolute value of the reset voltage.

19. The method of claim 11, wherein the control circuit that is configured to apply another voltage having the second polarity to the first memory cell during the reset operation.

20. The method of claim 11, wherein
the applying the reset voltage to the first memory cell during the reset operation further comprises:
applying a first reset voltage to the selected first wire;
applying a second reset voltage to the selected second wire; and
applying a third reset voltage to unselected first wires and unselected second wires, and
the applying a cancel voltage ($V_{cancel}$) further comprises:
applying a first cancel voltage to the selected first wire;
applying a second cancel voltage to the selected second wire; and
applying a third cancel voltage to the unselected first wires and the unselected second wires, wherein applying the first cancel voltage, applying the second cancel voltage and applying the third cancel voltage are done at the same time, and
wherein the third reset voltage and the third cancel voltage have the same voltage values.

* * * * *